United States Patent
Li

(10) Patent No.: US 11,864,448 B2
(45) Date of Patent: Jan. 2, 2024

(54) ORGANIC LIGHT-EMITTING DIODE DEVICE

(71) Applicant: WUHAN CHINA STAR OPTOELECTRONICS SEMICONDUCTOR DISPLAY TECHNOLOGY CO., LTD., Hubei (CN)

(72) Inventor: Yuanhang Li, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 635 days.

(21) Appl. No.: 16/971,225

(22) PCT Filed: May 15, 2020

(86) PCT No.: PCT/CN2020/090471
§ 371 (c)(1),
(2) Date: Aug. 19, 2020

(87) PCT Pub. No.: WO2021/159625
PCT Pub. Date: Aug. 19, 2021

(65) Prior Publication Data
US 2023/0131015 A1    Apr. 27, 2023

(30) Foreign Application Priority Data
Feb. 10, 2020 (CN) .......................... 202010085336.8

(51) Int. Cl.
| H10K 59/40 | (2023.01) |
| G06F 3/044 | (2006.01) |
| G06V 40/13 | (2022.01) |

(52) U.S. Cl.
CPC ........... H10K 59/40 (2023.02); G06F 3/0445 (2019.05); G06V 40/1306 (2022.01)

(58) Field of Classification Search
CPC ... H10K 59/40; G06F 3/0445; G06V 40/1306
See application file for complete search history.

(56) References Cited

U.S. PATENT DOCUMENTS

| 2016/0328068 A1* | 11/2016 | Ba-Tis | ................ G01L 5/0038 |
| 2017/0069852 A1* | 3/2017 | Kanamoto | ........... H10K 85/342 |
| 2017/0336910 A1 | 11/2017 | Han | |
| 2019/0197282 A1* | 6/2019 | Gong | .................... G06F 3/0412 |

FOREIGN PATENT DOCUMENTS

| CN | 106802747 A | 6/2017 | |
| CN | 208126362 U | 11/2018 | |
| CN | 110427121 A | 11/2019 | |
| CN | 110427125 A * | 11/2019 | ........... G06F 3/0412 |
| CN | 110427125 A | 11/2019 | |

* cited by examiner

Primary Examiner — Doon Y Chow
(74) Attorney, Agent, or Firm — PV IP PC; Wei Te Chung; Zhigang Ma

(57) ABSTRACT

The organic light-emitting diode (OLED) device of the present invention includes a display panel; a touch control structure disposed on the display panel and including: a first touch control layer and a second touch control layer, which are electrically connected to each other; and a fingerprint identification structure disposed on a same layer as the second touch control layer.

8 Claims, 4 Drawing Sheets

ORGANIC LIGHT-EMITTING DIODE DEVICE

BACKGROUND OF INVENTION

Field of Invention

This application relates to a field of an organic light-emitting diode (OLED), and specifically to an OLED device.

Description of Prior Art

With the widespread use of mobile terminals such as smart phones, which can support more and more applications, and their functions are becoming more and more powerful, the smart phones are developing in a diversified and personalized direction and become indispensable electronic supplies in users' lives. In order to improve the users' experience of using the smart phones, screens of mobile phones are also getting larger and larger, and screen-to-body ration is getting higher and higher. The emergence of full-screens has led to rapid development of under-screen fingerprint identification technology.

In the related technologies of the currently known technologies, OLED touch control screens are mostly plug-in structures, and On-cell touch control screens have also appeared and gradually developed. However, fingerprint identification is still conducted by plug-in way, which will increase thicknesses of the screens and terminals, thus increasing the manufacturing processes and cost of a module, thereby impacting the user experience. According to the current development trend of panel technology, fingerprint identification and panel integration will become the future development trend.

SUMMARY OF INVENTION

An embodiment of the present application provides an OLED device to solve the technical problem that the OLED device uses an external touch control structure in the prior art, resulting in a thicker OLED device.

An embodiment of the present application provides an organic light-emitting diode (OLED) device, including: a display panel; a touch control structure disposed on the display panel and including: a first touch control layer and a second touch control layer, which are electrically connected to each other; and a fingerprint identification structure disposed on a same layer as the second touch control layer.

Further, the first touch control layer includes: a plurality of first touch control electrodes disposed on the display panel; and a first insulating layer disposed on the display panel and covering the first touch control electrodes; and the second touch control layer includes: a plurality of second touch control electrodes disposed on the first insulating layer, wherein a projection of the second touch control electrodes on the display panel and a projection of the first touch control electrodes on the display panel cross each other and have an overlapping area; and a second insulating layer disposed on the first insulating layer and covering the second touch control electrodes.

Further, the display panel includes a display area and a border area surrounding the display area, and the display area includes a fingerprint identification area and a touch control area surrounding the fingerprint identification area, wherein the fingerprint identification structure is disposed in the fingerprint identification area; and wherein the second touch control layer is disposed in the touch control area, the second touch control layer includes a plurality of touch control leads, and the touch control leads are electrically connected to the second touch control electrodes disposed at opposite sides of the fingerprint identification area symmetrically.

Further, the touch control structure further includes: first peripheral leads disposed in the border area, wherein the first peripheral leads and the first touch control electrodes are disposed in a same layer, the first touch control electrodes are provided with first wires corresponding to the first peripheral leads, and the first wires penetrate the first insulating layer to connect the first peripheral leads; and second peripheral leads disposed in the border area, wherein the second peripheral leads and the second touch control electrodes are disposed in a same layer, the second touch control electrodes are provided with second wires corresponding to the second peripheral leads, and the second wires are connected to the second peripheral leads.

Further, the OLED device further includes a flexible circuit board disposed in the border area, and including a touch control chip and a fingerprint identification chip, wherein the flexible circuit board is electrically connected to the first peripheral leads and the second peripheral leads; and wherein the fingerprint identification structure includes a plurality of signal leads, and the signal leads extend from the fingerprint identification area to the border area to connect the flexible circuit board.

Further, a distance between adjacent ones of the first wires ranges from 100 μm to 200 μm; a distance between adjacent ones of the second wires ranges from 100 μm to 200 μm.

Further, the fingerprint identification structure includes: a plurality of receiving units arranged in an array, wherein any one of the receiving units is connected to the flexible circuit board through a corresponding signal lead; and a plurality of transmitting units longitudinally arranged correspondingly on a side of the receiving units close to the display panel.

Further, the second touch control layer is disposed on the display panel; and the first touch control layer is disposed on a side of the second touch control layer away from the display panel.

Further, materials of the first touch control electrodes and the second touch control electrodes include at least one of titanium, gold, silver, copper, lithium, sodium, potassium, magnesium, aluminum, zinc, indium tin oxide, aluminum-doped zinc oxide, and antimony-doped tin oxide; and materials of the first insulating layer and the second insulating layer include at least one of silicon nitride, silicon oxide, and organic photoresist.

Further, the display panel includes: a substrate; an array driving circuit layer disposed on the substrate; an organic light-emitting layer disposed on the array driving circuit layer; and an encapsulation layer disposed on the organic light-emitting layer, wherein the touch control structure is disposed on the encapsulation layer.

The organic light-emitting diode (OLED) device of the present invention is provided with the fingerprint identification system and the second touch control layer in a same layer, which effectively reduces the thickness of the OLED device and the production cost of the OLED device, and thus realizes the integration of under-screen fingerprint identification and touch control. Meanwhile, the fingerprint identification is conducted by using a capacitive structure, and multiple sets of sensing electrodes share a transmitting electrode signal, wherein each of the sensing electrodes is derived from an independent receiving electrode signal line, and a data selector multiplexer (MUX) design is used to add TFT switching circuit between adjacent signal lines for signal selection from the adjacent signal lines, which constitute a first-level MUX structure, such that a number of signal lines led to the flexible circuit board can be reduced by half, thereby saving costs.

BRIEF DESCRIPTION OF DRAWINGS

The technical solutions and other beneficial effects of the present application will be apparent through the detailed description of the specific implementation of the present application in conjunction with the accompanying drawings.

Figure 1:
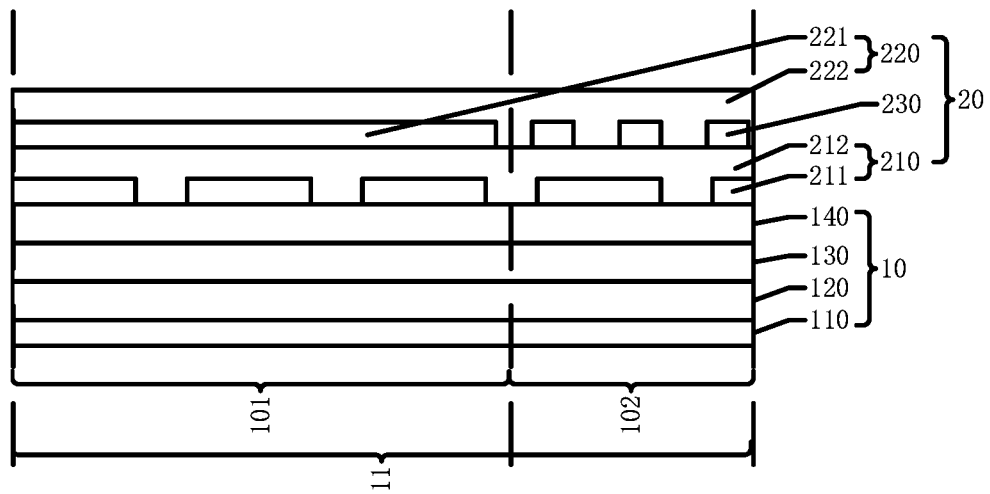
FIG. 1 is a schematic side view of the OLED device in Embodiment 1.

Elements in the drawings are designated by reference numerals listed below.
1 OLED device; 10 display panel;
20 touch control structure; 110 substrate;
120 array driving circuit layer; 130 organic light-emitting layer;
140 thin-film encapsulation layer; 210 first touch control layer;
220 second touch control layer; 230 fingerprint identification structure;
11 display area; 12 border area;
101 fingerprint identification area; 102 touch control area;
211 first touch control electrode; 212 first insulating layer;
213 first peripheral lead; 221 second touch control electrode;
222 second insulating layer; 223 second peripheral lead;
2301 receiving unit; 2302 transmitting unit;
2303 signal lead; 121 flexible circuit board;
1201 touch control chip; 1202 fingerprint identification chip;
224 touch control leads.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

The terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

Embodiment 1

As shown in FIG. 1, in this embodiment, the OLED device 1 of the present invention includes a display panel 10 and a touch control structure 20.

The display panel 10 includes a substrate 110, an array driving circuit layer 120, an organic light emitting layer 130, and a thin-film encapsulation layer 140.

The touch control structure 20 includes a first touch control layer 210, a second touch control layer 220 and a fingerprint identification structure 230.

Figure 2:
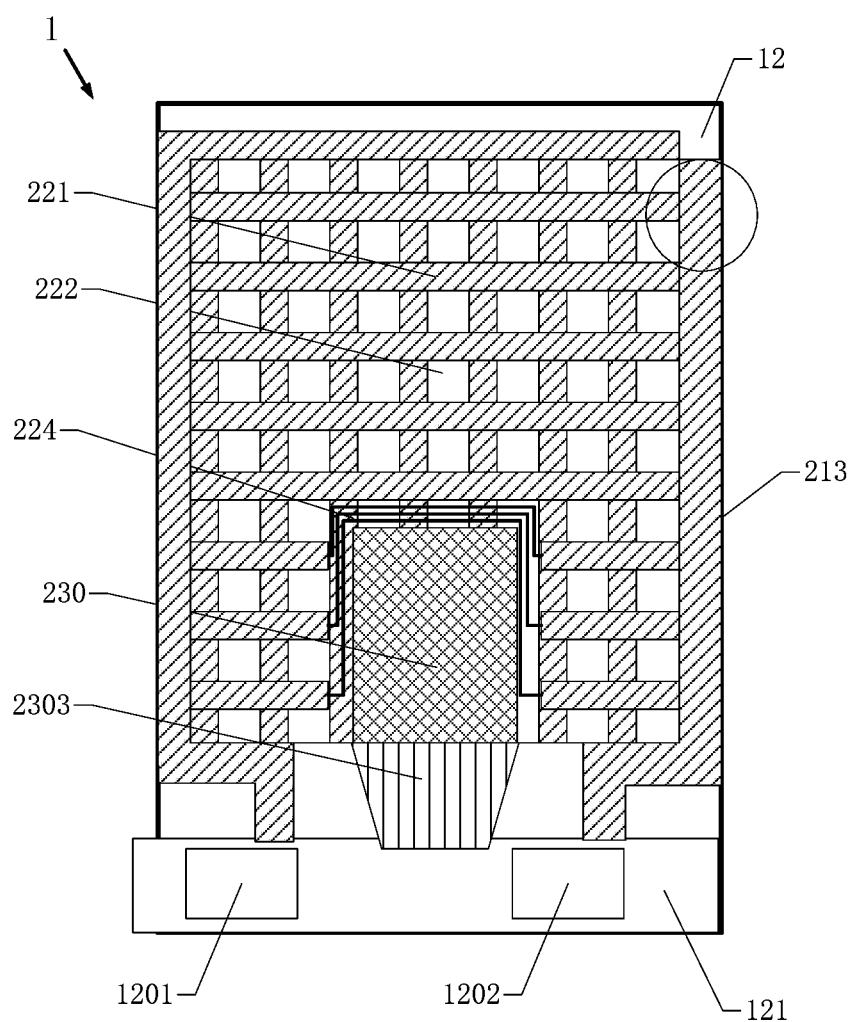
FIG. 2 is a schematic plan view of the OLED device in Embodiment 1.

As shown in FIG. 2, the OLED device 1 further includes a display area 11 and a border area 12 surrounding the display area 11, wherein the display area 11 includes a fingerprint identification area 101 and a touch control area 102 surrounding the fingerprint identification area 101.

Figure 4:
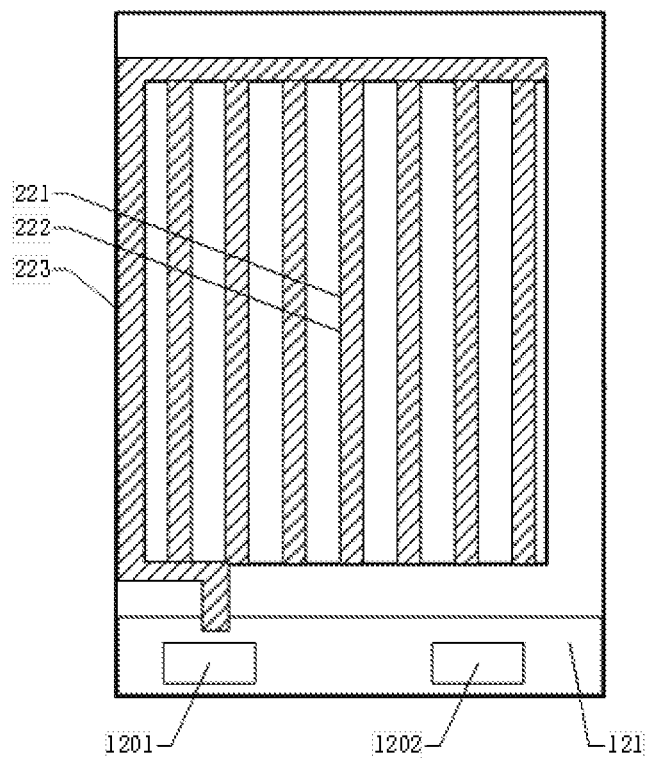
FIG. 4 is a schematic plan view of the first touch control layer in Embodiment 1.

As shown in FIG. 4, the first touch control layer 210 is disposed in the display area 11 of the display panel 10. The first touch control layer 210 includes first touch control electrodes 211 and a first insulating layer 212.

The first touch control electrodes 211 have a strip shape, which are evenly arranged on the display panel 10 in a row direction, and the first insulating layer 212 is provided on the display panel 10 and covers the first touch control electrodes 211.

The first touch control layer 210 further includes first peripheral leads 213 disposed in the border area 12, and disposed in a layer same as the first touch control electrodes 211 and disposed around the first touch control electrodes 211. Specifically, the first touch control electrodes 211 are provided with first wires corresponding to the first peripheral leads 213, and the first wires connect the first touch control electrodes 211 and the first periphery leads 213.

Figure 3:
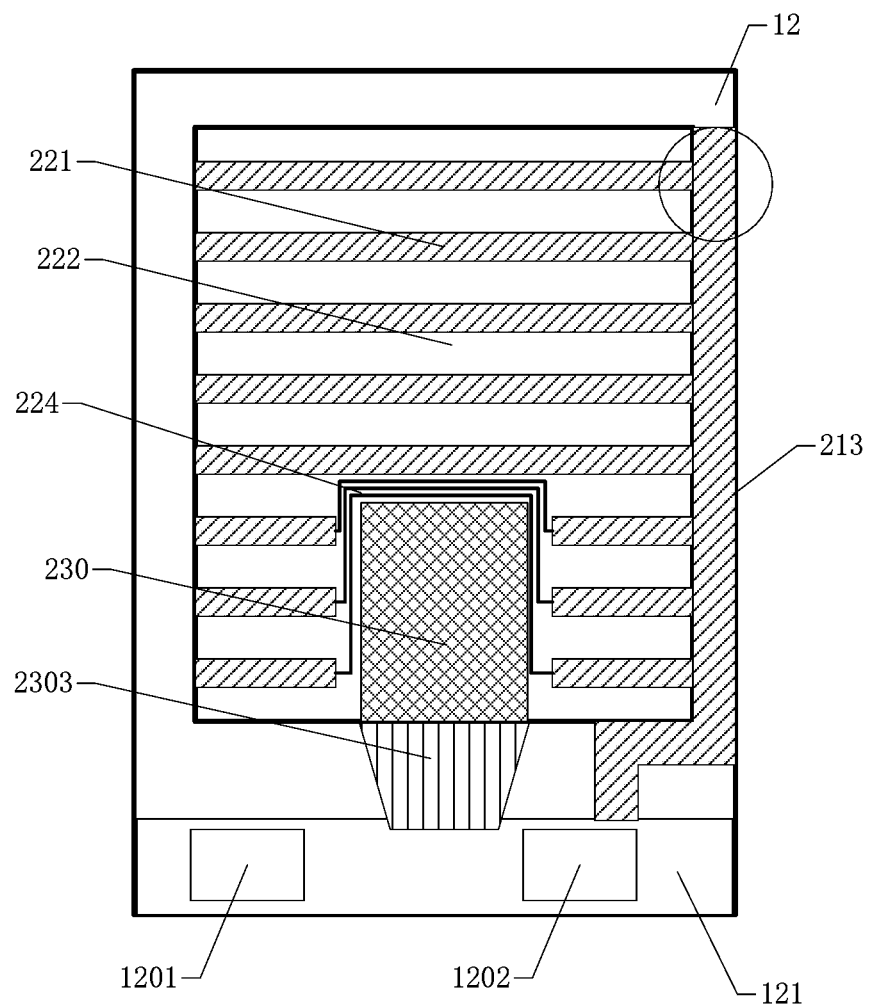
FIG. 3 is a schematic plan view of the second touch control layer in Embodiment 1.

As shown in FIG. 3, the second touch control layer 220 is disposed in the touch control area 102 on the first touch control layer 210, and the second touch control layer 220 includes second touch control electrodes 221 and a second insulating layer 222.

The second touch control electrodes 221 have a strip shape, which are evenly arranged on the first insulating layer 212 in a column direction, and the second insulating layer 222 is disposed on the first insulating layer 212 and covers the second touch control electrodes 221.

The second touch control layer 220 further includes second peripheral leads 223, which are disposed in a layer same as the second touch control electrodes 221 and disposed in the border area 12 to surround the second touch control electrodes 221. Specifically, the second touch control electrodes 221 are provided with second wires corresponding to the second peripheral leads 223, and the second wires connect the second touch control electrodes 221 and the second periphery leads 223.

Materials of the first touch control electrodes 211 and the second touch control electrodes 221 include at least one of titanium, gold, silver, copper, lithium, sodium, potassium, magnesium, aluminum, zinc, indium tin oxide, aluminum-doped zinc oxide, and antimony-doped tin oxide.

Materials of the first insulating layer 212 and the second insulating layer 222 are organic insulating materials or inorganic insulating materials, such as silicon nitride, silicon oxide, and organic photoresist.

Figure 6:
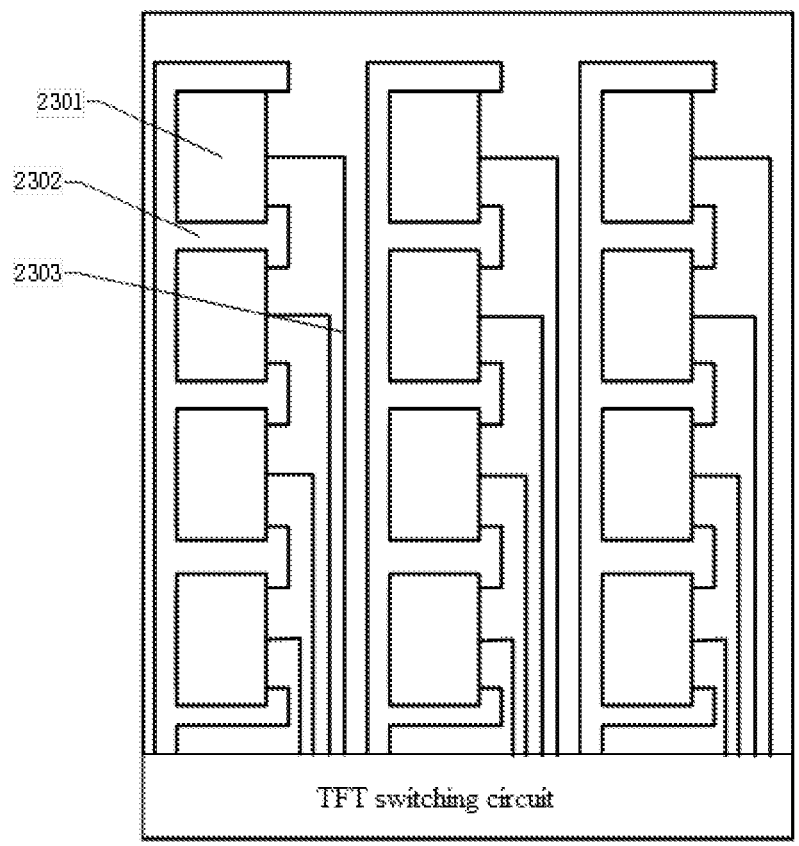
FIG. 6 is a schematic plan view of the fingerprint identification structure in Embodiment 1.

As shown in FIG. 6, the fingerprint identification structure 230 and the second touch control layer 220 are arranged in the same layer. Specifically, the fingerprint identification structure 230 is provided in the fingerprint identification area 101, and the fingerprint identification structure 230 includes a plurality of receiving units 2301 arranged in an array and a plurality of transmitting units 2302 disposed under the receiving units 2301, wherein each of the receiving units 2301 leads to a signal lead 2303 that extends from the fingerprint identification area 101 and converges in the border area 12. A flexible circuit board 121 is provided in the border area 12, and a touch control chip (TIC) 1201 and a fingerprint identification chip 1202 are provided on the flexible circuit board 121.

The first peripheral leads 213 and the second peripheral leads 223 converge on the flexible circuit board 121 from the border area 12.

The signal leads 2303 of the fingerprint identification structure 230 adopt a self-capacity design, and a TFT switch circuit is added between the adjacent ones of the signal leads 2303 for signal selection from the adjacent signal lines, which constitute a first-level MUX structure, such that a number of signal lines led to the flexible circuit board can be reduced by half.

Figure 5:
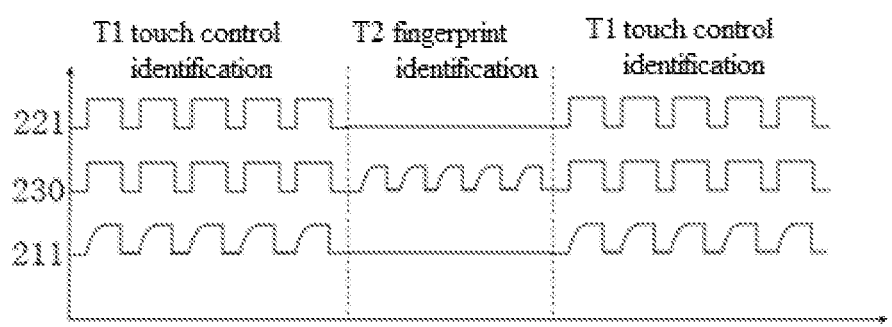
FIG. 5 is a timing diagram of the fingerprint identification structure and the touch control layer in Embodiment 1.

As shown in FIG. 5, the fingerprint identification structure 230 and the touch control structure are driven in a time-sharing manner, the touch control function is turned on at a T1 stage, and the fingerprint identification structure 230 and the second touch control electrodes 221 are given a same driving voltage. The fingerprint recognition structure 230 serves as the second touch electrodes in a U-shaped region to perform partition charging corresponding to the first touch electrodes 211, so that the U-shaped area (fingerprint identification area 102) can also perform normal touch control operations. Tn a T2 fingerprint identification stage, the fingerprint identification structure 230 is charged, to realize self-capacity fingerprint identification, and the first touch control electrodes 211 and the second touch control electrodes 221 are in a ground state at the t2 stage, which will not impact the normal operation of the fingerprint identification circuit. The periods and amplitudes of the pulse square waves used in the touch control electrodes and fingerprint identification structure of the present invention are inconsistent.

The second touch control layer 220 further includes touch control leads 224. Since the second touch control electrodes 221 are disposed in the touch control area 102, and the touch control area 102 is disposed around the fingerprint identification area 101, the second touch control electrodes 221 on opposite sides of the fingerprint identification area 101 are "separated" by the fingerprint identification area 101. In order to electrically connect the second touch electrodes 221 on opposite sides of the fingerprint identification area 101, the touch control leads 224 are correspondingly connected to the second touch electrodes 221 on opposite sides of the fingerprint identification area 101.

Embodiment 2

Figure 7:
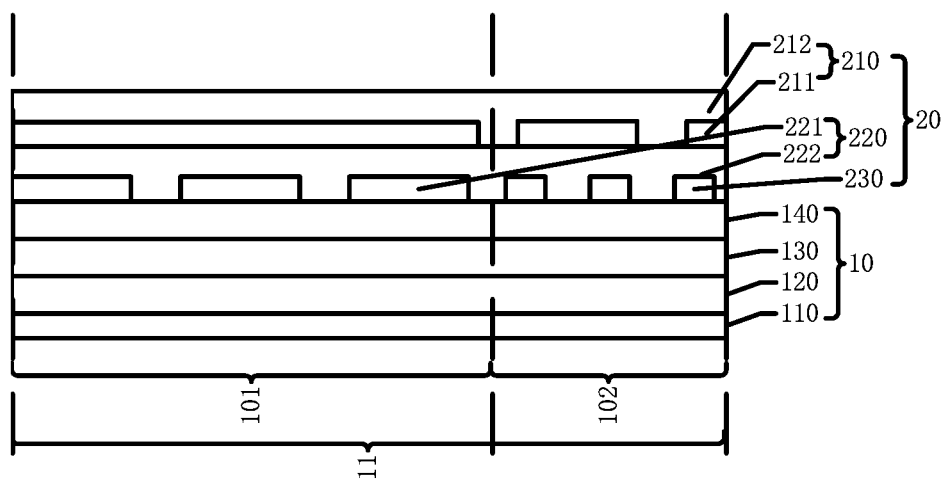
FIG. 7 is a schematic side view of the OLED device in Embodiment 2.

As shown in FIG. 7, in this embodiment, the structure of the OLED device 1 is substantially similar to that in Embodiment 1, except that the second touch control layer 220 and the first touch control layer 210 in the touch control structure 21 have a different positional relationship. Specifically, the second touch control layer 220 is disposed on the display panel 10, the first touch control layer 210 is disposed on the second touch control layer 220, and the fingerprint identification structure 230 is disposed in the same layer as the second touch control layer 220, that is, the fingerprint identification structure 230 is disposed in the fingerprint identification area 101 above the first touch control layer 210.

The foregoing is a detailed description of a backlight module provided by the embodiments of the present disclosure. The principles and implementations of the present disclosure are described herein by using specific examples. The description of the above embodiments is only for helping to understand the method of the present disclosure, and the core concept. Also, those skilled in the art may make some changes in the specific implementation and application scope without departing from the concept of the present disclosure. In summary, the content of the present specification should not be construed as limiting the disclosure.

The invention claimed is:

1. An organic light-emitting diode (OLED) device, comprising:
    a display panel;
    a touch control structure disposed on the display panel and comprising:
    a first touch control layer and a second touch control layer, wherein the first touch control layer and the second touch control layer are electrically connected to each other;
    the first touch control layer comprising:
        a plurality of first touch control electrodes; and
        a first insulating layer covering the first touch control electrodes; and
    the second touch control layer comprising:
        a plurality of second touch control electrodes, wherein a projection of the second touch control electrodes on the display panel and a projection of the first touch control electrodes on the display panel cross each other and have an overlapping area; and
        a second insulating layer covering the second touch control electrodes; and
    a fingerprint identification structure disposed on a same layer as the second touch control layer, comprising:
        a plurality of receiving units arranged in an array, wherein any one of the receiving units is connected to a flexible circuit board through a corresponding signal lead; and
        a plurality of transmitting units longitudinally arranged correspondingly on a side of the receiving units close to the display panel;
        wherein a number of the receiving units is identical to a number of the transmitting units.

2. The OLED device according to claim 1, wherein the display panel comprises a display area and a frame area surrounding the display area, and the display area comprises a fingerprint identification area and a touch control area surrounding the fingerprint identification area,
    wherein the fingerprint identification structure is disposed in the fingerprint identification area; and wherein the second touch control layer is disposed in the touch control area, the second touch control layer comprises a plurality of touch control leads, and the touch control leads are electrically connected to the second touch control electrodes symmetrically disposed at opposite sides of the fingerprint identification area.

3. The OLED device according to claim 2, wherein the touch control structure further comprises:
first peripheral leads disposed in the frame area, wherein the first peripheral leads and the first touch control electrodes are disposed in a same layer, the first touch control electrodes are provided with first wires corresponding to the first peripheral leads, and the first wires penetrate the first insulating layer to connect the first peripheral leads; and
second peripheral leads disposed in the frame area, wherein the second peripheral leads and the second touch control electrodes are disposed in a same layer, the second touch control electrodes are provided with second wires corresponding to the second peripheral leads, and the second wires are connected to the second peripheral leads.

4. The OLED device according to claim 3, further comprising:
a flexible circuit board disposed in the frame area, and comprising a touch control chip and a fingerprint identification chip,
wherein the flexible circuit board is electrically connected to the first peripheral leads and the second peripheral leads; and
wherein the fingerprint identification structure comprises a plurality of signal leads, and the signal leads extend from the fingerprint identification area to the frame area to connect with the flexible circuit board.

5. The OLED device according to claim 3, wherein:
a distance between adjacent ones of the first wires ranges from 100 μm to 200 μm;
a distance between adjacent ones of the second wires ranges from 100 μm to 200 μm.

6. The OLED device according to claim 1, wherein:
the second touch control layer is disposed on the display panel; and
the first touch control layer is disposed on a side of the second touch control layer away from the display panel.

7. The OLED device according to claim 1, wherein
materials of the first touch control electrodes and the second touch control electrodes comprise at least one of titanium, gold, silver, copper, lithium, sodium, potassium, magnesium, aluminum, zinc, indium tin oxide, aluminum-doped zinc oxide, and antimony-doped tin oxide; and
materials of the first insulating layer and the second insulating layer comprise at least one of silicon nitride, silicon oxide, and organic photoresist.

8. The OLED device according to claim 1, wherein the display panel comprises:
a substrate;
an array driving circuit layer disposed on the substrate;
an organic light-emitting layer disposed on the array driving circuit layer; and
an encapsulation layer disposed on the organic light-emitting layer, wherein the touch control structure is disposed on the encapsulation layer.

* * * * *